United States Patent
Kodama

(10) Patent No.: US 6,663,748 B2
(45) Date of Patent: Dec. 16, 2003

(54) METHOD OF FORMING A THIN FILM

(75) Inventor: Shinichi Kodama, Kagoshima (JP)

(73) Assignee: NEC LCD Technologies, Ltd., Kanagawa (JP)

( * ) Notice: Subject to any disclaimer, the term of this patent is extended or adjusted under 35 U.S.C. 154(b) by 0 days.

(21) Appl. No.: 10/117,199

(22) Filed: Apr. 8, 2002

(65) Prior Publication Data
US 2002/0150695 A1 Oct. 17, 2002

(30) Foreign Application Priority Data

Apr. 17, 2001 (JP) .......................... 2001-118080

(51) Int. Cl.[7] .................................................. C23F 1/00
(52) U.S. Cl. ............................ 156/345.43; 156/345.51; 427/535; 427/576
(58) Field of Search ........................ 156/345.45, 345.43, 156/345.47, 345.51; 427/576, 535

(56) References Cited

U.S. PATENT DOCUMENTS 6,159,333 A  * 12/2000 Gupta et al. ............. 156/345.1
6,218,288 B1 * 4/2001 Li et al. ..................... 438/627
6,283,060 B1 * 9/2001 Yamazaki et al. ......... 118/723 E
6,447,613 B1 * 9/2002 Haraguchi et al. .......... 118/728
6,506,312 B1 * 1/2003 Bottomfield ................. 216/11
6,514,471 B1 * 2/2003 Hsiung et al. ........... 423/240 S

FOREIGN PATENT DOCUMENTS

JP          4-239130       8/1992
JP          2000-164570    6/2000

* cited by examiner

*Primary Examiner*—Bret Chen
(74) *Attorney, Agent, or Firm*—Young & Thompson

(57) ABSTRACT

A method of maintaining a plasma electrode and a substrate holder in a deposition chamber of a plasma enhanced chemical vapor deposition system is provdied. Each of the plasma electrode and the substrate holder comprises an aluminum-based material coated with an alumina protection film. The method comprises the steps of: after a plasma enhanced chemical vapor deposition process is carried out to a substrate, taking out the substrate from the deposition chamber; introducing a reaction gas into the deposition chamber; causing a reaction of the reaction gas for cleaning an inner wall of the deposition chamber; introducing an oxygen-containing gas into the deposition chamber; and generating an oxygen-containing gas plasma to form the alumina protection film on surfaces of the plasma electrode and the substrate holder.

18 Claims, 1 Drawing Sheet

METHOD OF FORMING A THIN FILM

BACKGROUND OF THE INVENTION

1. Field of the Invention

The present invention relates to a method of forming a thin film, and more particularly to a plasma enhanced chemical vapor deposition method.

2. Description of the Related Art

A plasma enhanced chemical vapor deposition method is one of the most important techniques for forming a thin film in the semiconductor manufacturing processes. A thin film is often formed over a glass substrate by use of the plasma enhanced chemical vapor deposition method. The thin film is deposited over almost entirety of an upper surface of the glass substrate which is placed in a deposition chamber of a plasma enhanced chemical vapor deposition system. The deposition chamber has an inner wall and electrodes. The deposition may appear not only on the glass substrate but also on the inner wall of the deposition chamber and the electrodes in the deposition chamber.

As the thin deposited on the inner wall becomes thick, this may generate particles in the deposition chamber, wherein the particles may make a semiconductor device defective. In order to avoid this problem, it is necessary to carry out a plasma discharge process using $NF_3$ gas or $SF_6$ gas for removing the once deposited thin film from the inner wall of the deposition chamber.

The plasma discharge process may, however, cause unintended removals of alumina protection films which cover a surface of a substrate holder which is made of an aluminum-based material and also of an electrode surface. Aluminum is inferior in adhesion with the deposited thin film as compared to alumina film. The removals of the alumina protection films may generate particles in the deposition chamber, wherein the particles may make a semiconductor device defective.

For the above-described reasons, when the alumina protection film is etched from the surface of the substrate holder or the surface of the electrode, then the substrate holder or the electrode is removed from the deposition chamber for subsequently carrying out an alumite process to the substrate holder or the electrode in accordance with an anodic oxidation method, thereby forming the alumina protection film. This additional process is, of course, inconvenient and drops the manufacturing efficiency.

In the above circumstances, the development of a novel plasma enhanced chemical vapor deposition method free from the above problems is desirable.

SUMMARY OF THE INVENTION

Accordingly, it is an object of the present invention to provide a novel plasma enhanced chemical vapor deposition method free from the above problems.

It is a further object of the present invention to provide a novel plasma enhanced chemical vapor deposition method, wherein an alumina protection film is formed on a surface of either a substrate holder and an electrode in a deposition chamber of a plasma enhanced chemical vapor deposition system without, however, opening the deposition chamber.

It is another object of the present invention to provide a novel method of maintaining a plasma electrode and a substrate holder in a deposition chamber of a plasma enhanced chemical vapor deposition system free from the above problems.

It is a further object of the present invention to provide a novel method of maintaining a plasma electrode and a substrate holder in a deposition chamber of a plasma enhanced chemical vapor deposition system, wherein an alumina protection film is formed on a surface of either a substrate holder and an electrode in a deposition chamber of a plasma enhanced chemical vapor deposition system without, however, opening the deposition chamber.

The present invention provides a method of maintaining a plasma electrode and a substrate holder in a deposition chamber of a plasma enhanced chemical vapor deposition system. Each of the plasma electrode and the substrate holder comprises an aluminum-based material coated with an alumina protection film. The method comprises the steps of: after a plasma enhanced chemical vapor deposition process is carried out to a substrate, taking out the substrate from the deposition chamber; introducing a reaction gas into the deposition chamber; causing a reaction of the reaction gas for cleaning an inner wall of the deposition chamber; introducing an oxygen-containing gas into the deposition chamber; and generating an oxygen-containing gas plasma to form the alumina protection film on surfaces of the plasma electrode and the substrate holder.

The above and other objects, features and advantages of the present invention will be apparent from the following descriptions.

BRIEF DESCRIPTION OF THE DRAWINGS

Preferred embodiments according to the present invention will be described in detail with reference to the accompanying drawing.

DETAILED DESCRIPTION OF THE PREFERRED EMBODIMENTS

Figure 1:
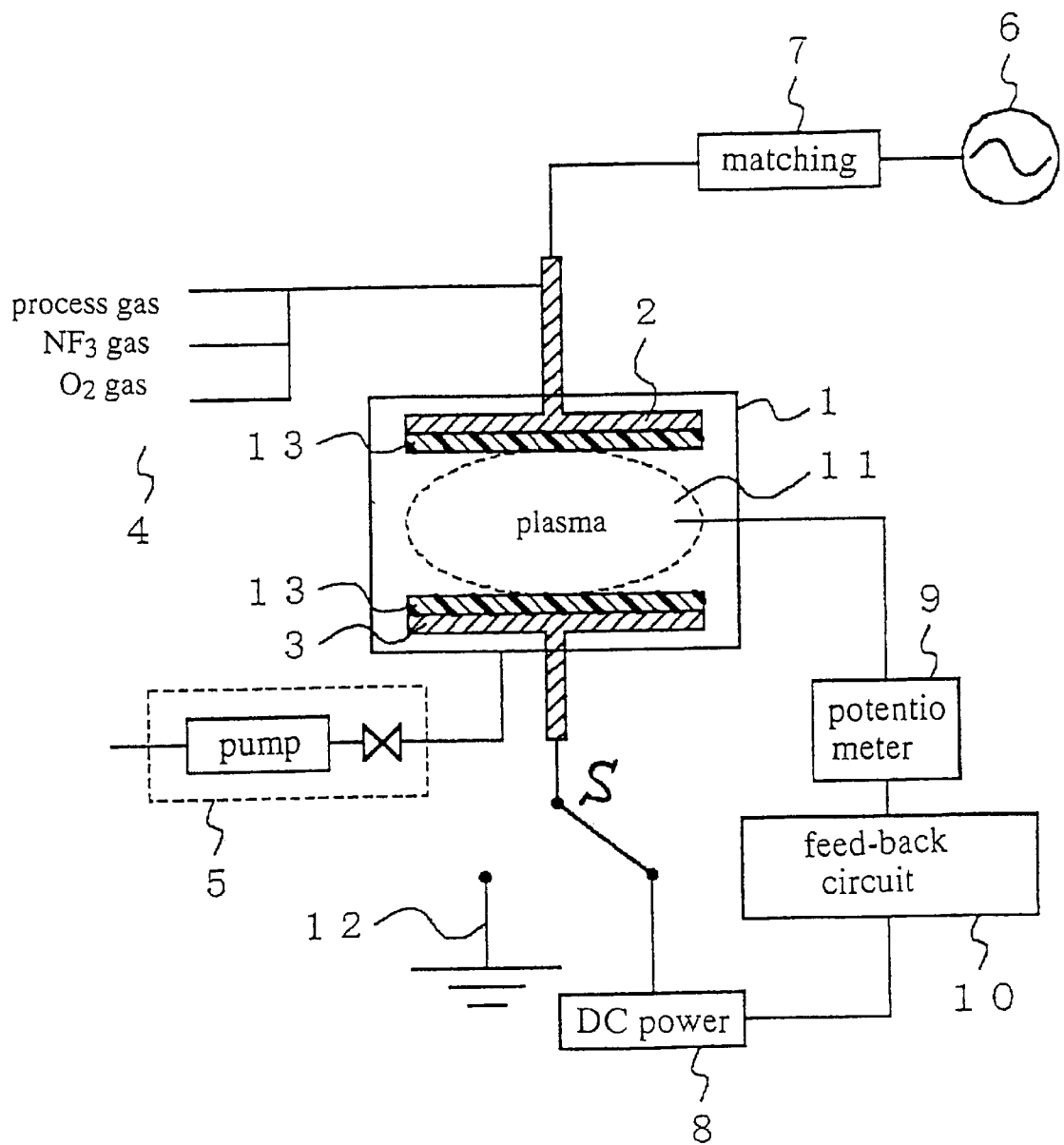
FIG. 1 is a block diagram illustrative of a plasma enhanced chemical vapor deposition system including a deposition chamber in a first embodiment in accordance with the present invention.

A first aspect of the present invention is a method of maintaining a plasma electrode and a substrate holder in a deposition chamber of a plasma enhanced chemical vapor deposition system. Each of the plasma electrode and the substrate holder comprises an aluminum-based material coated with an alumina protection film. The method comprises the steps of: after a plasma enhanced chemical vapor deposition process is carried out to a substrate, taking out the substrate from the deposition chamber; introducing a reaction gas into the deposition chamber; causing a reaction of the reaction gas for cleaning an inner wall of the deposition chamber introducing an oxygen-containing gas into the deposition chamber; and generating an oxygen-containing gas plasma to form the alumina protection film on surfaces of the plasma electrode and the substrate holder.

It is preferable that the step of generating the oxygen-containing plasma is so carried out as to avoid that the alumina protection films are etched from the surfaces of the plasma electrode and the substrate holder by the plasma enhanced chemical vapor deposition process.

It is also preferable that the step of generating the oxygen-containing plasma is so carried out as to form the alumina protection films at a thickness which is approximately equal to or thicker than a reduced thickness by the plasma enhanced chemical vapor deposition process.

It is also preferable that the step of generating the oxygen-containing plasma is carried out under application of an adjusted DC voltage to the substrate holder, and the adjustment to the DC voltage is made based on a measured potential of the oxygen-containing gas plasma.

It is also preferable that the adjustment to the DC voltage is so made that an amplitude center of an RF traveling wave potential is adjusted to zero potential.

It is also preferable that the substrate holder comprises a substrate stage for supporting a substrate to be processed by the plasma enhanced chemical vapor deposition process.

A second aspect of the present invention is a method of forming alumina protection films on surfaces of a plasma electrode and a substrate holder in a deposition chamber of a plasma enhanced chemical vapor deposition system. Each of the plasma electrode and the substrate holder comprises an aluminum-based material. The method comprises the steps of: introducing an oxygen-containing gas into the deposition chamber; and generating an oxygen-containing gas plasma to form the alumina protection film on the surfaces of the plasma electrode and the substrate holder.

It is preferable that the step of generating the oxygen-containing plasma is so carried out as to avoid that the alumina protection films are etched from the surfaces of the plasma electrode and the substrate holder by the plasma enhanced chemical vapor deposition process.

It is also preferable that the step of generating the oxygen-containing plasma is so carried out as to form the alumina protection films at a thickness which is approximately equal to or thicker than a reduced thickness by the plasma enhanced chemical vapor deposition process.

It is preferable that the step of generating the oxygen-containing plasma is carried out under application of an adjusted DC voltage to the substrate holder, and the adjustment to the DC voltage is made based on a measured potential of the oxygen-containing gas plasma.

It is preferable that the adjustment to the DC voltage is so made that an amplitude center of an RF traveling wave potential is adjusted to zero potential.

It is preferable that the substrate holder comprises a substrate stage for supporting a substrate to be processed by the plasma enhanced chemical vapor deposition process.

A third aspect of the present invention is a plasma enhanced chemical vapor deposition method by use of a plasma enhanced chemical vapor deposition system including a deposition chamber accommodating a plasma electrode and a substrate holder. Each of the plasma electrode and the substrate holder comprises an aluminum-based material coated with an alumina protection film. The plasma enhanced chemical vapor deposition method comprises the steps of: carrying out a plasma enhanced chemical vapor deposition process to a substrate; taking out the substrate from the deposition chamber; introducing a reaction gas into the deposition chamber; causing a reaction of the reaction gas for cleaning an inner wall of the deposition chamber; introducing an oxygen-containing gas into the deposition chamber; and generating an oxygen-containing gas plasma to form the alumina protection film on surfaces of the plasma electrode and the substrate holder.

It is preferable that the step of generating the oxygen-containing plasma is so carried out as to avoid that the alumina protection films are etched from the surfaces of the plasma electrode and the substrate holder by the plasma enhanced chemical vapor deposition process.

It is preferable that the step of generating the oxygen-containing plasma is so carried out as to form the alumina protection films at a thickness which is approximately equal to or thicker than a reduced thickness by the plasma enhanced chemical vapor deposition process.

It is preferable that the step of generating the oxygen-containing plasma is carried out under application of an adjusted DC voltage to the substrate holder, and the adjustment to the DC voltage is made based on a measured potential of the oxygen-containing gas plasma.

It is preferable that the adjustment to the DC voltage is so made that an amplitude center of an RF traveling wave potential is adjusted to zero potential.

It is preferable that the substrate holder comprises a substrate stage for supporting a substrate to be processed by the plasma enhanced chemical vapor deposition process.

First Embodiment

A first embodiment according to the present invention will be described in detail with reference to the drawing. FIG. 1 is a block diagram illustrative of a plasma enhanced chemical vapor deposition system including a deposition chamber in a first embodiment in accordance with the present invention.

The plasma enhanced chemical vapor deposition system has the following structure. A deposition chamber 1 accommodates a plasma electrode 2 and a substrate holder 3. The plasma electrode 2 and the substrate holder 3 comprise aluminum based materials coated with alumina protection films. The plasma electrode 2 and the substrate holder 3 are placed confronting each other.

An RF power supply 6 is electrically connected through a matching circuit 7 to the plasma electrode 2 for applying an AC voltage to the plasma electrode 2. The substrate holder 3 is electrically connected through a switch "S" to selected one of an earth 12 and a DC power supply 8. If the earth 12 is electrically connected to the substrate holder 3, then the potential of the substrate holder 3 is grounded. If the DC power supply 8 is electrically connected to the substrate holder 3, then a DC voltage is applied to the substrate holder 3.

A gas supply system 4 is mechanically coupled to the deposition chamber 1 for selectively supplying a semiconductor process gas, an $NF_3$ gas and an $O_2$ gas into the deposition chamber 1. A vacuum exhaust system 5 including a vacuum pump is also mechanically coupled to the deposition chamber 1 for discharging the gas from the deposition chamber 1 to obtain a reduced pressure of 1E-1 Pa order of the deposition chamber 1.

Under the reduced pressure of 1E-1 Pa order of the deposition chamber 1, the RF power supply 6 applies the AC voltage to the plasma electrode 2, whilst the DC power supply 8 applies the DC voltage to the substrate holder 3. A potentiometer 9 is provided for measuring a potential of a plasma 11 generated in an inter-space between the plasma electrode 2 and the substrate holder 3. The potentiometer 9 is electrically connected through a feed-back circuit 10 to the DC power supply 8. The measured potential is fed back through the feed-back circuit 10 to the DC power supply 8. The DC power supply 8 applies such an adjusted DC-voltage to the substrate holder 3 that an amplitude center of an RF traveling wave potential is adjusted to zero potential. The DC voltage is optimally adjusted for carrying out an oxidation process with $O_2$-plasma in the inter-space between the plasma electrode 2 and the substrate holder 3 to form alumina films 13 on surfaces of the plasma electrode 2 and the substrate holder 3. Deposition conditions for forming the alumina films, for example, the voltage level applied to the plasma electrode 2, the pressure of the deposition chamber and the distance between the plasma electrode 2 and the substrate holder 3, depend upon respective sizes of the deposition chamber 1, the plasma electrode 2 and the substrate holder 3 and also upon the thickness of the alumina films 13. The alumina films 13 may be deposited on respective surfaces of the plasma electrode 2 and the substrate holder 3 without opening the deposition chamber 1.

In accordance with the normal processes, the alumina protection film 13 is reduced or etched by a thickness of about 0.2 micrometers or less per one day in the average. For example, it is preferable that the above described process is carried out two times per one day, wherein each process is continued for 2.5 hours to deposit the alumina films 13 at a thickness of 0.1 micrometer, thereby preventing that the aluminum based materials for the plasma electrode 2 and the substrate holder 3 are exposed. Namely, it is possible to maintain semi-permanently the sufficient thickness of the alumina protection films 13 on the plasma electrode 2 and the substrate holder 3.

As described above, in accordance with the present invention, after the plasma enhanced chemical vapor deposition process is carried out by the plasma enhanced chemical vapor deposition system whereby the thickness of the alumina protection films on the plasma electrode and the substrate holder are reduced, then an oxygen gas is subsequently introduced into the deposition chamber and an oxygen-plasma is caused to form the alumina protection films on the plasma electrode and the substrate holder without opening the deposition chamber.

The above described substrate holder may comprise a substrate stage for supporting a substrate to be processed by the plasma enhanced chemical vapor deposition process.

Although the invention has been described above in connection with several preferred embodiments therefor, it will be appreciated that those embodiments have been provided solely for illustrating the invention, and not in a limiting sense. Numerous modifications and substitutions of equivalent materials and techniques will be readily apparent to those skilled in the art after reading the present application, and all such modifications and substitutions are expressly understood to fall within the true scope and spirit of the appended claims.

What is claimed is:

1. A method of maintaining a plasma electrode and a substrate holder in a deposition chamber of a plasma enhanced chemical vapor deposition system, and each of said plasma electrode and said substrate holder comprising an aluminum-based material coated with an alumina protection film, said method comprising the steps of:

after a plasma enhanced chemical vapor deposition process is carried out to a substrate, taking out said substrate from said deposition chamber;

after removing the substrate from said deposition chamber, performing the following steps, introducing a reaction gas into said deposition chamber;

causing a reaction of said reaction gas for cleaning an inner wall of said deposition chamber;

introducing an oxygen-containing gas into said deposition chamber; and generating an oxygen-containing gas plasma to form said alumina protection film on surfaces of said plasma electrode and said substrate holder.

2. The method as claimed in claim 1, wherein said step of generating said oxygen-containing plasma is so carried out as to avoid that said alumina protection films are etched from said surfaces of said plasma electrode and said substrate holder by said plasma enhanced chemical vapor deposition process.

3. The method as claimed in claim 1, wherein said step of generating said oxygen-containing plasma is so carried out as to form said alumina protection films at a thickness that compensates for a reduction of thickness of the alumina film caused by the plasma enhanced chemical vapor deposition process.

4. The method as claimed in claim 1, wherein said step of generating said oxygen-containing plasma is carried out under application of an adjusted DC voltage to said substrate holder, and said adjustment to said DC voltage is made based on a measured potential of said oxygen-containing gas plasma.

5. The method as claimed in claim 4, wherein said adjustment to said DC voltage is so made that an amplitude center of an RF traveling wave potential is adjusted to zero potential.

6. The method as claimed in claim 1, wherein said substrate holder comprises a substrate stage for supporting a substrate to be processed by said plasma enhanced chemical vapor deposition process.

7. A method of forming alumina protection films on surfaces of a plasma electrode and a substrate holder in a deposition chamber of a plasma enhanced chemical vapor deposition system, and each of said plasma electrode and said substrate holder comprising an aluminum-based material, said method comprising the steps of:

after a substrate has been removed from the deposition chamber, introducing an oxygen-containing gas into said deposition chamber and generating an oxygen-containing gas plasma to form said alumina protection film on said surfaces of said plasma electrode and said substrate holder.

8. The method as claimed in claim 7, wherein said step of generating said oxygen-containing plasma is so carried out as to avoid that said alumina protection films are etched from said surfaces of said plasma electrode and said substrate holder by said plasma enhanced chemical vapor deposition process.

9. The method as claimed in claim 7, wherein said step of generating said oxygen-containing plasma is so carried out as to form said alumina protection films at a thickness that compensates for a reduction of thickness of the alumina film caused by the plasma enhanced chemical vapor deposition process.

10. The method as claimed in claim 7, wherein said step of generating said oxygen-containing plasma is carried out under application of an adjusted DC voltage to said substrate holder, and said adjustment to said DC voltage is made based on a measured potential of said oxygen-containing gas plasma.

11. The method as claimed in claim 10, wherein said adjustment to said DC voltage is so made that an amplitude center of an RF traveling wave potential is adjusted to zero potential.

12. The method as claimed in claim 7, wherein said substrate holder comprises a substrate stage for supporting a substrate to be processed by said plasma enhanced chemical vapor deposition process.

13. A plasma enhanced chemical vapor deposition method by use of a plasma enhanced chemical vapor deposition system including a deposition chamber accommodating a plasma electrode and a substrate holder, and each of said plasma electrode and said substrate holder comprising an aluminum-based material coated with an alumina protection film, said plasma enhanced chemical vapor deposition method comprising, in order, the steps of:

carrying out a plasma enhanced chemical vapor deposition process to a substrate;

taking out said substrate from said deposition chamber;

introducing a reaction gas into said deposition chamber;

causing a reaction of said reaction gas for cleaning an inner wall of said deposition chamber;

introducing an oxygen-containing gas into said deposition chamber; and generating an oxygen-containing gas plasma to form said alumina protection film on surfaces of said plasma electrode and said substrate holder.

14. The plasma enhanced chemical vapor deposition method as claimed in claim 13, wherein said step of generating said oxygen-containing plasma is so carried out as to avoid that said alumina protection films are etched from said surfaces of said plasma electrode and said substrate holder by said plasma enhanced chemical vapor deposition process.

15. The plasma enhanced chemical vapor deposition method as claimed in claim 13, wherein said step of generating said oxygen-containing plasma is so carried out as to form said alumina protection films at a thickness which is approximately equal to or thicker than a reduced thickness by said plasma enhanced chemical vapor deposition process.

16. The plasma enhanced chemical vapor deposition method as claimed in claim 13, wherein said step of generating said oxygen-containing plasma is carried out under application of an adjusted DC voltage to said substrate holder, and said adjustment to said DC voltage is made based on a measured potential of said oxygen-containing gas plasma.

17. The plasma enhanced chemical vapor deposition method as claimed in claim 16, wherein said adjustment to said DC voltage is so made that an amplitude center of an RF traveling wave potential is adjusted to zero potential.

18. The plasma enhanced chemical vapor deposition method as claimed in claim 13, wherein said substrate holder comprises a substrate stage for supporting a substrate to be processed by said plasma enhanced chemical vapor deposition process.

* * * * *